(12) United States Patent
Liu

(10) Patent No.: US 10,411,700 B2
(45) Date of Patent: *Sep. 10, 2019

(54) METHOD AND APPARATUS FOR DRIVING POWER SWITCH TUBE

(71) Applicant: Huawei Technologies Co., Ltd., Shenzhen, Guangdong (CN)

(72) Inventor: Xujun Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 135 days.

This patent is subject to a terminal disclaimer.

(21) Appl. No.: 15/595,569

(22) Filed: May 15, 2017

(65) Prior Publication Data

US 2017/0250686 A1 Aug. 31, 2017

Related U.S. Application Data

(63) Continuation of application No. 14/224,295, filed on Mar. 25, 2014, now Pat. No. 9,680,467, which is a
(Continued)

(30) Foreign Application Priority Data

Aug. 28, 2012 (CN) .......................... 2012 1 0309979

(51) Int. Cl.
*H03K 17/691* (2006.01)
*H02M 1/088* (2006.01)
(Continued)

(52) U.S. Cl.
CPC ............ *H03K 17/691* (2013.01); *H02M 1/08* (2013.01); *H02M 1/088* (2013.01); *H02M 1/096* (2013.01);
(Continued)

(58) Field of Classification Search
CPC .......................... H02M 1/088; H03K 17/691
See application file for complete search history.

(56) References Cited

U.S. PATENT DOCUMENTS 5,514,921 A 5/1996 Steigerwald
6,911,848 B2 6/2005 Vinciarelli
(Continued)

FOREIGN PATENT DOCUMENTS

CN 101009486 A 8/2007
CN 101800476 A 8/2010
(Continued)

OTHER PUBLICATIONS

Machine Translation and Abstract of Chinese Publication No. CN101009486, Aug. 1, 2007, 5 pages.
(Continued)

*Primary Examiner* — Jeffrey M Shin
(74) *Attorney, Agent, or Firm* — Conley Rose, P.C.

(57) ABSTRACT

A method and an apparatus for driving a power switch tube. The apparatus includes an input unit, a drive unit, a transformer and a power switch tube. The input unit is connected to the drive unit, which is configured to input a group of drive signals, and the group of drive signals includes four drive signals, where the first drive signal and the second are complementary signals, and a dead time exists; the third drive signal and the fourth are complementary signals, and a dead time exists; the phase difference between the first drive signal and the third is 180 degrees, and the phase difference between the second drive signal and the fourth is 180 degrees; the drive unit is configured to power on a field winding of the transformer; and the transformer provides a drive voltage signal for the power switch tube.

11 Claims, 6 Drawing Sheets

Related U.S. Application Data continuation of application No. PCT/CN2013/071567, filed on Feb. 8, 2013.

(51) Int. Cl.
   *H02M 1/08* (2006.01)
   *H02M 1/096* (2006.01)
   *H03K 17/288* (2006.01)

(52) U.S. Cl.
   CPC ......... *H03K 17/288* (2013.01); *Y10T 307/944* (2015.04)

(56) References Cited

U.S. PATENT DOCUMENTS

| | | |
|---|---|---|
| 9,680,467 B2* | 6/2017 | Liu ................ H03K 17/691 |
| 2010/0213988 A1 | 8/2010 | Xiao |
| 2011/0101951 A1 | 5/2011 | Zhang et al. |
| 2011/0103097 A1 | 5/2011 | Wang et al. |
| 2012/0032509 A1 | 2/2012 | Fan et al. |
| 2014/0203666 A1 | 7/2014 | Liu |

FOREIGN PATENT DOCUMENTS

| | | |
|---|---|---|
| CN | 202218160 U | 5/2012 |
| CN | 102611310 A | 7/2012 |
| CN | 102832793 A | 12/2012 |
| EP | 0693826 A1 | 1/1996 |
| EP | 2393194 A1 | 12/2011 |
| JP | 2004187387 A | 7/2004 |

OTHER PUBLICATIONS

Machine Translation and Abstract of Chinese Publication No. CN102611310, Jul. 25, 2012, 8 pages.
Machine Translation and Abstract of Chinese Publication No. CN202218160, May 9, 2012, 6 pages.
Foreign Communication From a Counterpart Application, Chinese Application No. 201210309979.1, Chinese Office Action dated Apr. 16, 2014, 13 pages.
Foreign Communication From a Counterpart Application, European Application No. 13731553.5, Extended European Search Report dated Nov. 6, 2014, 19 pages.
Foreign Communication From a Counterpart Application, PCT Application No. PCT/CN2013/071567, English Translation of International Search Report dated May 23, 2013, 2 pages.
Foreign Communication From a Counterpart Application, PCT Application No. PCT/CN2013/071567, English Translation of Written Opinion dated May 23, 2013, 14 pages.

* cited by examiner

METHOD AND APPARATUS FOR DRIVING POWER SWITCH TUBE

CROSS-REFERENCE TO RELATED APPLICATIONS

This application is continuation of U.S. application Ser. No. 14/224,295, filed on Mar. 25, 2014, which is a continuation of International Application No. PCT/CN2013/071567, filed on Feb. 8, 2013, which claims priority to Chinese Patent Application No. 201210309979.1, filed on Aug. 28, 2012, All of the afore-mentioned patent applications are hereby incorporated by reference in their entireties.

TECHNICAL FIELD

The present disclosure relates to the field of power supplies, and in particular, to a method and an apparatus for driving a power switch tube.

BACKGROUND

With the development of electronic technologies, power conversion frequencies are higher and higher, and when the power switch tube is used to turn on or off a circuit, a manner of using a driver chip to directly drive a power switch tube poses high loss to the driver chip.

The driver chip may use a rectangular wave to drive the power switch tube. FIG. 1A is a schematic diagram of using a driver chip to drive a power switch tube, where an output end of the driver chip and the gate of the power switch tube are connected; and FIG. 1B is a waveform chart of a drive signal that is input by the power switch tube, where the driver chip has high loss and low reliability, which are disadvantageous for improving power conversion frequencies.

SUMMARY

Embodiments of the present disclosure provide a method and an apparatus for driving a power switch tube to solve problems of high surge current, high loss for a driver chip, and low reliability in the prior art, by implementing low-loss driving of the power switch tube and improving reliability.

In a first aspect, an embodiment of the present disclosure provides an apparatus for driving a power switch tube, where the apparatus includes an input unit, which is connected to a drive unit and configured to input a group of drive signals into the drive unit, and the group of drive signals include a first drive signal, a second drive signal, a third drive signal, and a fourth drive signal, where the first drive signal and the second drive signal are complementary signals, and a dead time is between the first drive signal and the second drive signal for a first field-effect transistor of the first drive signal and a second field-effect transistor of the second drive signal to implement zero-voltage switching; the third drive signal and the fourth drive signal are complementary signals, and a dead time is between the third drive signal and the fourth drive signal for a third field-effect transistor of the third drive signal and a fourth field-effect transistor of the fourth drive signal to implement zero-voltage switching; the phase difference between the first drive signal and the third drive signal is 180 degrees for alternately conducting the first field-effect transistor and the third field-effect transistor, and the phase difference between the second drive signal and the fourth drive signal is 180 degrees for alternately conducting the second field-effect transistor and the fourth field-effect transistor; the drive unit, which includes the first field-effect transistor, the second field-effect transistor, the third field-effect transistor, and the fourth field-effect transistor, and is configured to power on a field winding of a transformer according to the group of drive signals that is input by the input unit; the transformer, which has specified magnetizing inductance that is configured to store energy, and according to the stored energy, the transformer inputs a drive voltage signal into the control end of the power switch tube through the field winding of the transformer, or inputs a drive voltage signal into the control end of the power switch tube through the induced voltage of an output winding of the transformer induced from the field winding; and the power switch tube, which is connected to the transformer, and includes a parasitic capacitance. The parasitic capacitance and the transformer constitute a resonant circuit configured to control that the drive voltage signal of the power switch tube has a slow edge rate.

In a second aspect, an embodiment of the present disclosure provides an apparatus for driving a power switch tube, where the apparatus includes an input unit, which is connected to a drive unit and configured to input a group of drive signals into the drive unit; the drive unit, which includes a plurality of field-effect transistors, and is configured to control the statuses of the plurality of field-effect transistors and power on a field winding of a transformer according to the group of drive signals that is input by the input unit; the transformer, which is connected to the drive unit and a rectifier unit, and has specified magnetizing inductance that is configured to store energy, and according to the stored energy, the transformer inputs a drive voltage signal into the control end of the power switch tube through the field winding of the transformer, or inputs a drive voltage signal into the control end of the power switch tube by making the induced voltage of an output winding of the transformer induced from the field winding, pass through the rectifier unit to implement zero-voltage switching for the plurality of field-effect transistors; where the rectifier unit includes at least one rectifier, and the rectifier includes a rectifier switch and a control circuit of the rectifier switch, which is configured to perform rectifier processing on the induced voltage of the output winding of the transformer induced from the field winding so as to obtain the drive voltage signal. The power switch tube, which is connected to the transformer, and includes a parasitic capacitance, where the parasitic capacitance and the transformer constitute a resonant circuit configured to control that the drive voltage signal of the power switch tube has a slow edge rate.

In a third aspect, an embodiment of the present disclosure provides a method for driving a power switch tube, where the method includes: powering on a field winding of a transformer according to an input group of drive signals, so the transformer stores energy; and inputting a drive voltage signal into the control end of the power switch tube through the field winding of the transformer, or inputting a drive voltage signal into the control end of the power switch tube through the induced voltage of an output winding of the transformer induced from the field winding, so the transformer periodically stores and releases energy, and make a field-effect transistor driven by the drive signal to implement zero-voltage switching according to a change of the transformer energy and a change of the group of drive signals.

Therefore, the method and apparatus, according to the embodiments of the present disclosure, power on a field winding of a transformer according to an input group of drive signals, input a drive voltage signal into the control end of a power switch tube through the field winding of the transformer, or input a drive voltage signal into the control end of the power switch tube through the induced voltage of an output winding of the transformer induced from the field winding. By applying the method and apparatus according to the embodiments of the present disclosure, low-loss driving of the power switch tube may be implemented, and reliability is improved.

DESCRIPTION OF EMBODIMENTS

To make the objectives, technical solutions, and advantages of the embodiments of the present disclosure more comprehensible, the following clearly describes the technical solutions in the embodiments of the present disclosure with reference to the accompanying drawings the embodiments of the present disclosure. Apparently, the described embodiments are merely a part rather than all of the embodiments of the present disclosure. All other embodiments obtained by persons of ordinary skill in the art based on the embodiments of the present disclosure without creative efforts shall fall within the protection scope of the present disclosure.

The present disclosure discloses a method and an apparatus for driving a power switch tube, which powers on a field winding of a transformer according to an input group of drive signals, inputs a drive voltage signal into the control end of the power switch tube through the field winding of the transformer, or inputs a drive voltage signal into the control end of the power switch tube through the induced voltage of an output winding of the transformer induced from the field winding. Therefore, a problem of high rush current of the drive voltage signal is solved, and low-loss driving of the power switch tube is implemented.

Figure 1A:
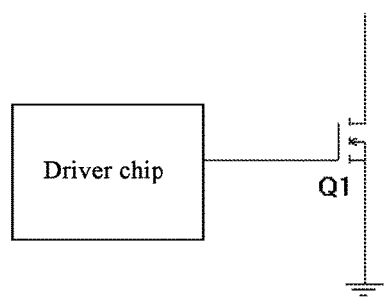
FIG. 1A and FIG. 1B are a schematic diagram of using a driver chip to drive a power switch tube and a waveform chart of a drive signal.
Figure 1B:
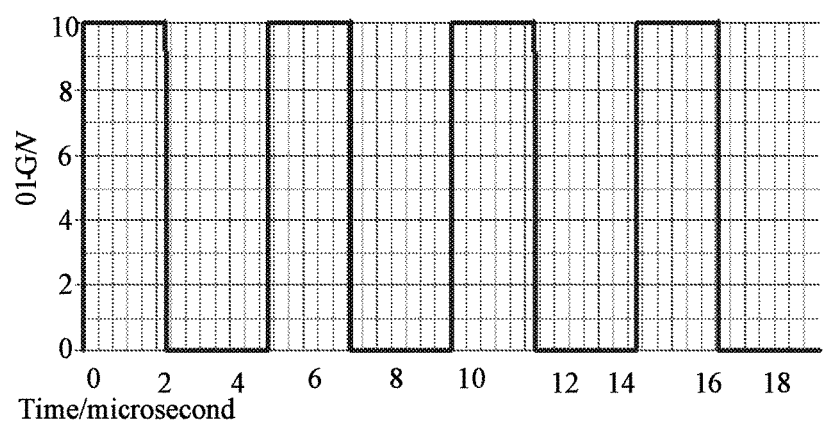
Figure 2:
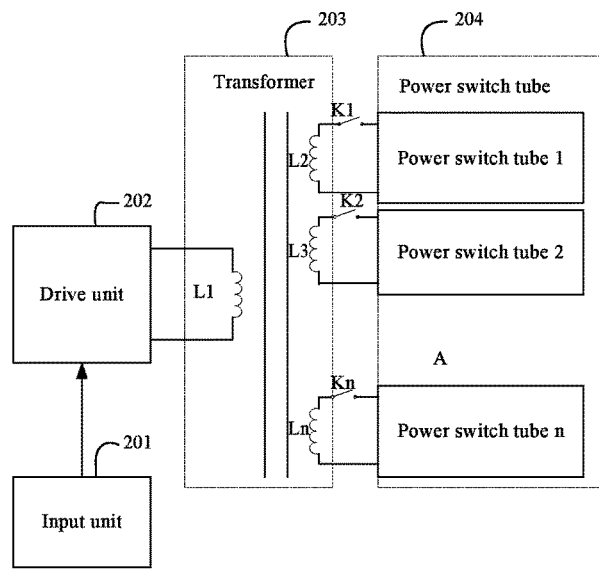
FIG. 2 is a schematic diagram of an apparatus for driving a power switch tube according to an embodiment of the present disclosure.

FIG. 2 is a schematic diagram of an apparatus for driving a power switch tube according to an embodiment of the present disclosure. As shown in FIG. 2, the embodiment includes an input unit 201, a drive unit 202, a transformer 203, and a power switch tube 204.

The input unit 201 is connected to the drive unit 202, and may input a group of drive signals into the drive unit 202.

The group of drive signals includes a first drive signal, a second drive signal, a third drive signal, and a fourth drive signal, where the first drive signal and the second drive signal are complementary signals, and a dead time is between the first drive signal and the second drive signal, that is, there exists a period that the first drive signal and the second drive signal are simultaneously in low level, so it may be ensured that a first field-effect transistor controlled by the first drive signal or a second field-effect transistor controlled by the second drive signal implements zero-voltage switching when the first drive signal or the second drive signal changes from low level to high level, significantly reducing drive loss, the third drive signal and the fourth drive signal are complementary signals, and a dead time is between the third drive signal and the fourth drive signal, that is, there exists a period that the third drive signal and the fourth drive signal are simultaneously in low level, so it may be ensured that a third field-effect transistor controlled by the third drive signal or a fourth field-effect transistor controlled by the fourth drive signal implements zero-voltage switching when the third drive signal or the fourth drive signal changes from low level to high level, significantly reducing drive loss; the phase difference between the first drive signal and the third drive signal is 180 degrees, that is, the difference of timing is half of a period, for alternately conducting the first field-effect transistor and the third field-effect transistor, and the phase difference between the second drive signal and the fourth drive signal is 180 degrees, that is, the difference of timing is half of a period, for alternately conducting the second field-effect transistor and the fourth field-effect transistor.

The first drive signal is input into the gate of the first field-effect transistor in the drive unit 202, the second drive signal is input into the gate of the second field-effect transistor in the drive unit 202, the third drive signal is input into the gate of the third field-effect transistor in the drive unit 202, and the fourth drive signal is input into the gate of the fourth field-effect transistor in the drive unit 202; that is, the first drive signal, the second drive signal, the third drive signal, and the fourth drive signal that are input by the input unit 201 are configured to control the conduction or cutoff statuses of the first field-effect transistor, the second field-effect transistor, the third field-effect transistor, and the fourth field-effect transistor, respectively.

The drive unit 202 is configured to power on a field winding of the transformer according to the group of drive signals input by the input unit 201. The drive unit 202 includes the first field-effect transistor, the second field-effect transistor, the third field-effect transistor, and the fourth field-effect transistor.

Optionally, the drive unit 202 may further include a direct current power supply and a capacitance.

The drain of the first field-effect transistor is connected to the positive terminal of the direct current power supply, the source of the first field-effect transistor is connected to the drain of the second field-effect transistor and an end of the capacitance, and the gate of the first field-effect transistor is connected to the input unit 201 and is configured to receive the first drive signal output by the input unit 201; the source of the second field-effect transistor is grounded, and the gate of the second field-effect transistor is connected to the input unit 201 and is configured to receive the second drive signal output by the input unit 201; the drain of the third field-effect transistor is connected to the positive terminal of the direct current power supply, the source of the third field-effect transistor is connected to the drain of the fourth field-effect transistor and an end of a field winding of the transformer; the gate of the third field-effect transistor is connected to the input unit 201 and is configured to receive the third drive signal output by the input unit 201; the source of the fourth field-effect transistor is grounded and the gate of the fourth field-effect transistor is connected to the input unit 201 and is configured to receive the fourth drive signal that is output by the input unit 201; and the other end of the capacitance is connected to the other end of the field winding of the transformer. Therefore, when the first drive signal, the second drive signal, the third drive signal and the fourth drive signal change according to a preset frequency, the drive unit 202 powers on the field winding of the transformer according to the foregoing connection relationship between the field winding of the transformer and the drive unit.

The first field-effect transistor, the second field-effect transistor, the third field-effect transistor, and the fourth field-effect transistor constitute a full-bridge structure, where an end of the field winding of the transformer is connected to the middle point of a bridge arm of the full-bridge structure, and another bridge arm is directly connected to the middle point of another bridge arm of the full-bridge structure or is connected to the middle point of another bridge arm of the full-bridge structure through a capacitance. The conduction or cutoff statuses of the first field-effect transistor, the second field-effect transistor, the third field-effect transistor and the fourth field-effect transistor change with the variation of the group of drive signals, so the current that passes through the field winding of the transformer changes, so as to implement the powering of the field winding of the transformer.

The transformer 203 has specific magnetizing inductance configured to store energy, and according to the stored energy, the transformer inputs a drive voltage signal into the control end of the power switch tube through the field winding of the transformer, or inputs a drive voltage signal into the control end of the power switch tube through the induced voltage of an output winding of the transformer induced from the field winding. An end of the field winding of the transformer 203 is connected to the middle point of a bridge of the full-bridge structure in the drive unit 202, and the other end is connected to the middle point of another bridge arm of the full-bridge structure in the drive unit 202.

The transformer 203 has a plurality of field windings, where there are at least one field winding L1, and one or more output windings, such as L2, L3 . . . and Ln, and each end of the field winding may be connected to the control end, that is, the gate, of the power switch tube, and the two ends of each output winding may be directly connected to the gate and the source of the power switch tube respectively, so the conduction or cutoff statuses of the first field-effect transistor, the second field-effect transistor, the third field-effect transistor, and the fourth field-effect transistor change with the variation of the group of drive signals that is input by the input unit 201, the voltage of the two ends of the field winding of the transformer 203 changes, the current that passes through the field winding of the transformer changes, and the induced current and induced voltage that are generated by the output winding change. Therefore, the drive voltage signal of the power switch tube that is connected to the field winding and/or the output winding changes.

The power switch tube 204, which is connected to the transformer, includes a parasitic capacitance. The parasitic capacitance and the transformer, or the field winding and the output winding, constitute a resonant circuit configured to control that the drive voltage signal of the power switch tube has a slow edge rate.

As shown in FIG. 2, the power switch tube in the embodiment includes a power switch tube 1, a power switch tube 2 . . . and a power switch tube n; and because a parasitic capacitance and a parasitic resistance exist between the gate and the source of each power switch tube, for a power switch tube that is connected to the two ends of an output winding, a resonant circuit is constituted among the output winding, the parasitic capacitance and the parasitic resistance of the power switch tube, and the current of a field winding does not change suddenly, so the current of the two ends of the output winding does not change, and a drive voltage signal that is provided for the power switch tube that is connected to the two ends of the output winding has a relatively slow edge rate. Because the two ends of a field winding are respectively connected to a power switch tube, a resonant circuit is constituted among the field winding, parasitic capacitances and parasitic resistances of power switch tubes that are connected to power switch tubes; besides, the resonant circuit constituted by the output winding may also be reflected on the field winding, thereby driving voltage signals of the power switch tubes connected to the two ends of the field winding respectively, to also have relatively slow edge rates, significantly reducing power consumption.

Certainly, a capacitance may be added to the two ends of the field winding in the transformer 203, and the capacitance is connected to the resonant circuit to adjust a resonant frequency of the resonant circuit.

In the embodiment of the present disclosure, the apparatus for driving the power switch tube powers on the field winding of the transformer according to the input group of drive signals, inputs the drive voltage signal into the control end of the power switch tube through the field winding of the transformer, or inputs the drive voltage signal into the control end of the power switch tube through the induced voltage of the output winding of the transformer induced from the field winding. By applying the apparatus according to the embodiment of the present disclosure, low-loss driving of the power switch tube may be implemented, and reliability is improved.

Figure 3:
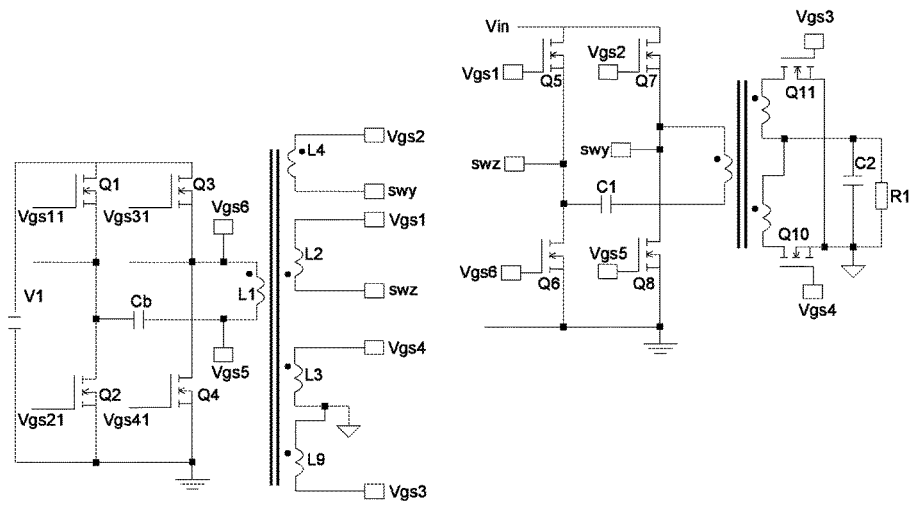
FIG. 3 is a schematic diagram of a typical application of an apparatus for driving a power switch tube according to an embodiment of the present disclosure.

FIG. 3 is a schematic diagram of a typical application of an apparatus for driving a power switch tube according to an embodiment of the present disclosure. As shown in FIG. 3, the typical application of the driving apparatus includes: an input unit, a drive unit for driving the power switch tube, a drive transformer, a group of power switch tubes, and load, where the input unit is configured to input a first drive signal Vgs11, a second drive signal Vgs21, a third drive signal Vgs31, and a fourth drive signal Vgs41 into the drive unit; the drive unit includes a first field-effect transistor Q1, a second field-effect transistor Q2, a third field-effect transistor Q3, a fourth field-effect transistor Q4, and a capacitance Cb; the drive transformer includes a field winding L1, and a plurality of output windings L2, L3, L4 and L9; the group of power switch tubes includes a plurality of power switch tubes Q5, Q6, Q7, Q8, Q10 and Q11, and the drive signals of the plurality of power switch tubes are provided by the drive transformer, and the load may include a capacitance C2 and a resistance R1 and so on.

As shown in FIG. 3, the gate of the first field-effect transistor Q1, the gate of the second field-effect transistor Q2, the gate of the third field-effect transistor Q3, and the gate of the fourth field-effect transistor Q4 are connected to a group of drive signals, where the group of drive signals includes the first drive signal Vgs11, the second drive signal Vgs21, the third drive signal Vgs31, and the fourth drive signal Vgs41. The first drive signal Vgs11 is input into the first field-effect transistor Q1, the second drive signal Vgs21 is input into the second field-effect transistor Q2, the third drive signal Vgs31 is input into the third field-effect transistor Q3, and the fourth drive signal Vgs41 is input into the fourth field-effect transistor Q4, and the group of drive signals periodically change to control the conduction or cutoff statuses of the field-effect transistors Q1, Q2, Q3, and Q4.

The first drive signal Vgs11 and the second drive signal Vgs21 are complementary signals, and a dead time is between the first drive signal Vgs11 and the second drive signal Vgs21, that is, there exists a period when the first drive signal Vgs11 and the second drive signal Vgs21 are simultaneously in low level, so it may be ensured the first field-effect transistor Q1 controlled by the first drive signal Vgs11 or the second field-effect transistor Q2 controlled by the second drive signal Vgs21 implements zero-voltage switching when the first drive signal Vgs11 or the second drive signal Vgs21 changes from low level to high level, significantly reducing drive loss; the third drive signal Vgs31 and the fourth drive signal Vgs41 are complementary signals, and a dead time is between the third drive signal Vgs31 and the fourth drive signal Vgs41, that is, there exists a period when the third drive signal Vgs31 and the fourth drive signal Vgs41 are simultaneously in low level, so it may be ensured a third field-effect transistor Q3 controlled by the third drive signal Vgs31 or a fourth field-effect transistor Q4 controlled by the fourth drive signal Vgs41 implements zero-voltage switching when the third drive signal Vgs31 or the fourth drive signal Vgs41 changes from low level to high level, significantly reducing drive loss; the phase difference between the first drive signal Vgs11 and the third drive signal Vgs31 is 180 degrees, that is, the difference of timing is half of a period, for alternately conducting the first field-effect transistor Q1 and the third field-effect transistor Q3, and the phase difference between the second drive signal Vgs21 and the fourth drive signal Vgs41 is 180 degrees, that is, the difference of timing is half of a period, for alternately conducting the second field-effect transistor Q2 and the fourth field-effect transistor Q4.

The first field-effect transistor Q1, the second field-effect transistor Q2, the third field-effect transistor Q3, and the fourth field-effect transistor Q4 constitute a full-bridge structure, where the drain of the first field-effect transistor Q1 is connected to the positive terminal of a direct current power supply V1, the source of the first field-effect transistor Q1 is connected to the drain of the second field-effect transistor Q2, and the gate of the first field-effect transistor is configured to receive the first drive signal Vgs11; the source of the second field-effect transistor Q2 is grounded, and the gate of the second field-effect transistor Q2 is configured to receive the second drive signal Vgs21; the drain of the third field-effect transistor is connected to the positive terminal of the direct current power supply V1, and the source of the third field-effect transistor Q3 is connected to the drain of the fourth field-effect transistor Q4 and an end of the field winding L1 of the transformer; the gate of the third field-effect transistor is configured to receive the third drive signal Vgs3; the source of the fourth field-effect transistor Q4 is grounded, and the gate of the fourth field-effect transistor Q4 is configured to receive the fourth drive signal Vgs4. The drive unit 202 may further include a capacitance, where an end of the capacitance Cb is connected to the source of the first field-effect transistor Q1 and the drain of the second field-effect transistor Q2, and the other end is connected to the other end of the field winding L1 of the transformer 203.

A voltage signal of an end of the field winding L1 of the transformer is Vgs5, which is connected to the gate of the power switch tube Q8 to provide a drive voltage signal for the power switch tube Q8; a voltage signal of the other end is Vgs6, which is connected to the gate of the power switch tube Q6 to provide a drive voltage signal for the power switch tube Q6. Therefore, a resonant circuit is formed among the power switch tube Q8, the field winding, and the power switch tube Q6. The voltage signals of the two ends of the output winding L2 are Vgs1 and swz, respectively, which are connected to the gate and the source of the power switch tube Q5, and Vgs1-swz is configured to provide a drive voltage signal for the power switch tube Q5, so a resonant circuit is formed between the L2 and the power switch tube Q5, where the resonant circuit has the equivalent effects as a resonant circuit between the field winding L1 and the power switch tube Q5. The voltage signals of the two ends of the output winding L3 are Vgs4 and 0, respectively, which are connected to the gate and the source of the power switch tube Q10, and Vgs4-0 is configured to provide a drive voltage signal for the power switch tube Q10, so a resonant circuit is formed between L3 and the power switch tube Q10, where the resonant circuit has the equivalent effects as a resonant circuit between the field winding L1 and the power switch tube Q10. Similarly, because the two ends Vgs2 and swy of the output winding L4 are connected to the gate and the source of the power switch tube Q7, respectively, a resonant circuit is formed between the L4 and the power switch tube Q7, where the resonant circuit has the equivalent effects as a resonant circuit between the field winding L1 and the power switch tube Q7. The voltage signals of the two ends of the output winding L9 are Vgs3 and 0, respectively, which are connected to the gate and the source of the power switch tube Q11, and Vgs3-0 is configured to provide a drive voltage signal for the power switch tube Q11, so a resonant circuit is formed between the L9 and the power switch tube Q11, where the resonant circuit has the equivalent effects as a resonant circuit between the field winding L1 and the power switch tube Q11. Because the foregoing working relationships exist in the typical application of the apparatus, a drive voltage signal that is provided for the control end of the power switch tube through a field winding of the transformer cannot change suddenly, but has a slow edge rate; and a drive voltage signal that is input into the control end of the power switch tube by an output winding of the transformer through the induced voltage of the output winding of the transformer induced from the field winding cannot change suddenly either, but has a slow edge rate.

Figure 4:
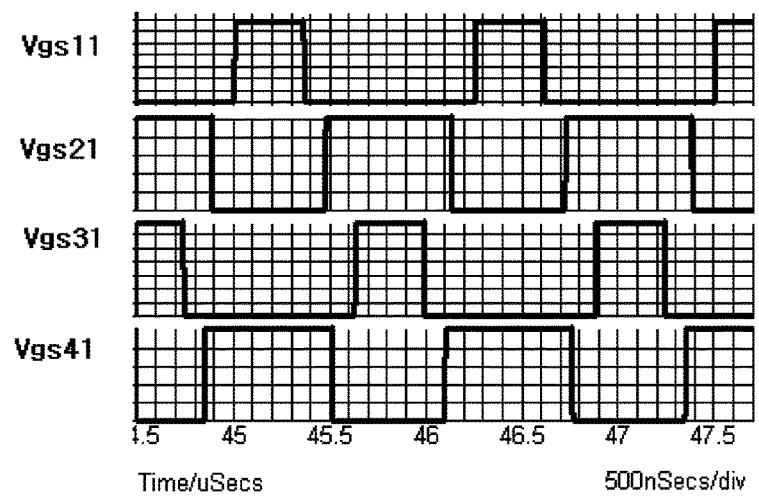
FIG. 4 is a sequence diagram of a drive signal of each field-effect transistor in an apparatus for driving a power switch tube according to an embodiment of the present disclosure.
Figure 5:
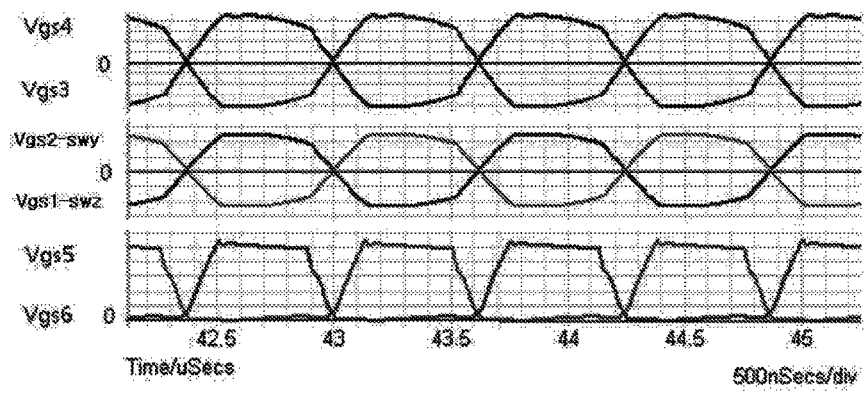
FIG. 5 is a sequence diagram of providing a drive voltage signal for each power switch tube based on a drive signal showed in FIG. 3 in an apparatus for driving a power switch tube according to an embodiment of the present disclosure.

As shown in FIG. 4 and FIG. 5, FIG. 4 is a sequence diagram of a drive signal of each field-effect transistor in an apparatus for driving a power switch tube according to an embodiment of the present disclosure; and FIG. 5 is a sequence diagram of providing a drive voltage signal for each power switch tube based on a drive signal showed in FIG. 3 in an apparatus for driving a power switch tube according to an embodiment of the present disclosure. As shown in FIG. 4, it may be seen that a first drive signal and a second drive signal are complementary signals, and a dead time is between the first drive signal and the second drive signal, that is, there exists a period when the first drive signal and the second drive signal are simultaneously in low level; a third drive signal and a fourth drive signal are complementary signals, and a dead time is between the third drive signal and the fourth drive signal, that is, there exists a period when the third drive signal and the fourth drive signal are simultaneously in low level; the phase difference between the first drive signal and the third drive signal is 180 degrees, that is, the difference of timing is half of a period; and the phase difference between the second drive signal and the fourth drive signal is 180 degrees, that is, the difference of timing is half of a period. As shown in FIG. 5, it may be seen that a drive voltage signal of each power switch tube has a relatively slow edge rate, and during the dead time of the first drive signal and the second drive signal, a resonance is formed between the field winding L1 and a power switch tube, and the drive signal Vgs6 reaches a maximum value, that is, when the drive signal Vgs6 reaches the voltage value V1 of the direct current power supply, each field-effect transistor in the drive unit 202 has no partial voltage, and when the drive signal Vgs11 changes from low level to high level, or the drive signal Vgs21 changes from low level to high level, zero-voltage switching is formed. During the dead time of the third drive signal and the fourth drive signal, a resonance is formed between the field winding L1 and a power switch tube, and the drive signal Vgs5 reaches the maximum value, that is, when the drive signal Vgs5 reaches the voltage value V1 of the direct current power supply, each field-effect transistor has no partial voltage, and when the drive signal Vgs31 changes from low level to high level, or the drive signal Vgs41 changes from low level to high level, zero-voltage switching is formed. It may be seen from the above, the drive voltage signal of each power switch tube is a drive voltage signal that does not change suddenly and has a relatively slow edge rate, significantly reducing power consumption.

As shown in FIG. 3, when the power switch tube is configured to drive a load, the input voltage Vin may be inconsistent with the voltage of the load, in this case, a transformer may be used to perform voltage conversion, and the input power and the output power of the transformer is theoretically equal, that is, the transformer may theoretically implement voltage conversion without power loss, and provide needed voltage for the load.

Therefore, in the typical application of the apparatus for driving a power switch tube according to the embodiment of the present disclosure, the field winding of the transformer is powered on according to the input group of drive signals, the drive voltage signal is input into the control end of the power switch tube through the field winding of the transformer, or the drive voltage signal is input into the control end of the power switch tube through the induced voltage of the output winding of the transformer induced from the field winding. By applying the apparatus according to the embodiment of the present disclosure, low-loss driving of the power switch tube may be implemented, and reliability is improved.

Figure 6:
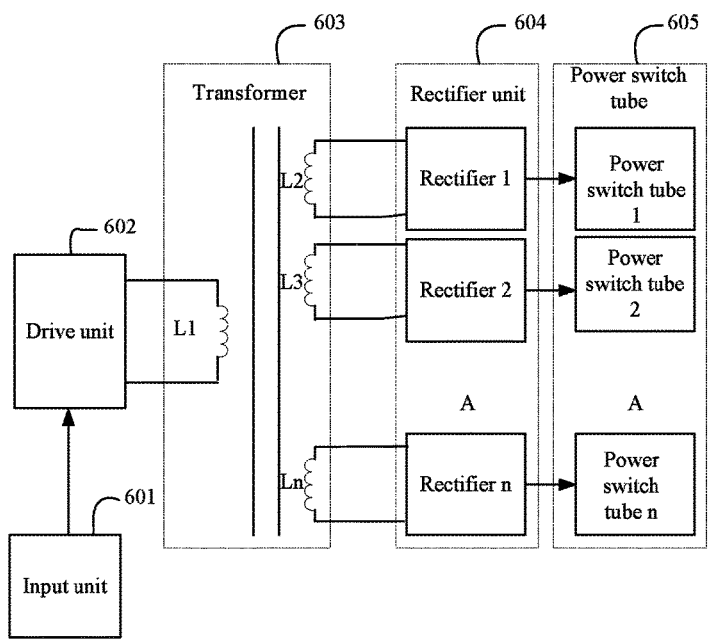
FIG. 6 is a schematic diagram of another apparatus for driving a power switch tube according to an embodiment of the present disclosure.

FIG. 6 is a schematic diagram of another apparatus for driving a power switch tube according to an embodiment of the present disclosure. As shown in FIG. 6, the embodiment includes an input unit 601, a drive unit 602, a transformer 603, a rectifier unit 604, and a power switch tube 605.

The input unit 601 is connected to the drive unit 602, and may input a group of drive signals into the drive unit 602. The group of drive signals may include four drive signals, and may also include two drive signals. If the drive unit 602 includes a full-bridge structure that is formed by four field-effect transistors, the group of drive signals may include four drive signals configured to drive the four field-effect transistors respectively; if the drive unit 602 includes a half-bridge structure that is formed by two field-effect transistors, the group of drive signals may include two drive signals configured to drive the two field-effect transistors respectively.

The embodiment takes an example of the group of drive signals that includes four drive signals which are configured to respectively drive each field-effect transistor in the drive unit 602, so as to describe the driving apparatus, and the group of drive signals that consists of two drive signals is not described in detail here.

The group of drive signals may include a first drive signal, a second drive signal, a third drive signal and a fourth drive signal. The first drive signal and the second drive signal are complementary signals, and a dead time is between the first drive signal and the second drive signal, that is, there exists a period when the first drive signal and the second drive signal are simultaneously in low level, so it may be ensured a first field-effect transistor controlled by the first drive signal or a second field-effect transistor controlled by the second drive signal implements zero-voltage switching when the first drive signal or the second drive signal changes from low level to high level, significantly reducing drive loss; the third drive signal and the fourth drive signal are complementary signals, and a dead time is between the third drive signal and the fourth drive signal, that is, there exists a period when the third drive signal and the fourth drive signal are simultaneously in low level, so it may be ensured a third field-effect transistor controlled by the third drive signal or a fourth field-effect transistor controlled by the fourth drive signal implements zero-voltage switching when the third drive signal or the fourth drive signal changes from low level to high level, significantly reducing drive loss; the phase difference between the first drive signal and the third drive signal is 180 degrees, that is, the difference of timing is half of a period, for alternately conducting the first field-effect transistor and the third field-effect transistor, and the phase difference between the second drive signal and the fourth drive signal is 180 degrees, that is, the difference of timing is half of a period, for alternately conducting the second field-effect transistor and the fourth field-effect transistor.

The first drive signal is input into the gate of the first field-effect transistor in the drive unit 602, the second drive signal is input into the gate of the second field-effect transistor in the drive unit 602, the third drive signal is input into the gate of the third field-effect transistor in the drive unit 602, and the fourth drive signal is input into the gate of the fourth field-effect transistor in the drive unit 602, that is, the first drive signal, the second drive signal, the third drive signal, and the fourth drive signal that are input by the input unit 601 are configured to control the conduction or cutoff statuses of first field-effect transistor, the second field-effect transistor, the third field-effect transistor, and the fourth field-effect transistor, respectively.

The drive unit 602 is configured to power on a field winding of the transformer according to the group of drive signals input by the input unit 601. The drive unit 602 includes the first field-effect transistor, the second field-effect transistor, the third field-effect transistor, and the fourth field-effect transistor.

Optionally, the drive unit 602 may further include a direct current power supply and a capacitance.

The drain of the first field-effect transistor is connected to the positive terminal of the direct current power supply, the source of the first field-effect transistor is connected to the drain of the second field-effect transistor and an end of the capacitance, and the gate of the first field-effect transistor is connected to the input unit 601 and is configured to receive the first drive signal output by the input unit 601; the source of the second field-effect transistor is grounded, and the gate of the second field-effect transistor is connected to the input unit 601 and is configured to receive the second drive signal output by the input unit 601; the drain of the third field-effect transistor is connected to the positive terminal of the direct current power supply, the source of the third field-effect transistor is connected to the drain of the fourth field-effect transistor and an end of a field winding of the transformer; the gate of the third field-effect transistor is connected to the input unit 601 and is configured to receive the third drive signal output by the input unit 601; the source of the fourth field-effect transistor is grounded and the gate of the fourth field-effect transistor is connected to the input unit 601 and is configured to receive the fourth drive signal output by the input unit 601; and the other end of the capacitance is connected to the other end of the field winding of the transformer. Therefore, when the first drive signal, the second drive signal, the third drive signal and the fourth drive signal change according to a preset frequency, the drive unit 602 powers on the field winding of the transformer according to the foregoing connection relationship between the field winding of the transformer and the drive unit.

The first field-effect transistor, the second field-effect transistor, the third field-effect transistor and the fourth field-effect transistor constitute a full-bridge structure, where an end of the field winding of the transformer is connected to the middle point of a bridge arm of the full-bridge structure, and the other end of the field winding of the transformer is directly connected to the middle point of another bridge arm of the full-bridge structure or is connected to the middle point of another bridge arm of the full-bridge structure through a capacitance. The conduction or cutoff statuses of the first field-effect transistor, the second field-effect transistor, the third field-effect transistor and the fourth field-effect transistor change with the variation of the group of signals, so the current that passes through the field winding of the transformer changes, so as to implement that the field winding of the transformer is powered on.

The transformer 603, which is connected to the rectifier unit 604 and the drive unit 602, and has specified magnetizing inductance that is configured to store energy, and according to the stored energy, the transformer inputs a drive voltage signal into the control end of the power switch tube through the field winding of the transformer, or inputs a drive voltage signal into the control end of the power switch tube by making the induced voltage of an output winding of the transformer induced from the field winding pass through the rectifier unit, which is configured to implement zero-voltage switching in a plurality of scenarios. An end of the field winding of the transformer 603 is connected to the middle point of a bridge of the full-bridge structure in the drive unit 602, and the other end is connected to the middle point of another bridge arm of the full-bridge structure in the drive unit 602.

The transformer 603 has a plurality of field windings, where there are at least one field winding and one output winding, and each end of a field winding may be connected to the control end, that is, the gate, of the power switch tube, and the two ends of each output winding pass through a rectifier in the rectifier unit 604 to be directly connected to the gate and the source of the power switch tube respectively, where the rectifier may be a rectifier switch, configured to rectify a voltage signal that is output by an output winding of the transformer 603, and take the rectified voltage signal as a drive voltage signal of the power switch tube that is connected to the output winding, so the conduction or cutoff statuses of the first field-effect transistor, the second field-effect transistor, the third field-effect transistor and the fourth field-effect transistor change, the voltage of the two ends of the field winding of the transformer 603 changes with the variation of the group of drive signals that is input by the input unit 601, the current that passes through the field winding of the transformer changes, and the induced current and induced voltage that is generated by the output winding changes. Therefore, the drive voltage signal of the power switch tubes which is connected to the field winding continuously changes, and the drive voltage signal of the power switch tube which is connected to the output winding after the output winding passes through the rectifier unit 604 changes.

The rectifier unit 604 includes at least one rectifier, where each rectifier includes a rectifier switch and a control circuit of the rectifier switch, which is configured to rectify the induced voltage of an output winding of the transformer induced from the field winding so as to obtain a drive voltage signal.

The rectifier unit 604 includes one or more rectifiers, and each output winding of the transformer passes through a rectifier to be connected to the power switch tube. A rectifier includes a rectifier switch and a control circuit of the rectifier switch, and the control circuit may control the conduction or cutoff of the rectifier switch, so as to rectify an induced voltage signal that is output by an output winding to obtain a unipolar drive voltage signal. Using a unipolar drive voltage signal to drive the power switch tube has a lower loss than using a bipolar drive voltage signal to drive the power switch tube. The following describes a method to rectify a bipolar drive voltage signal to a unipolar drive voltage signal in detail, which is not described here again.

The power switch tube 605 is connected to the transformer, including a parasitic capacitance, where the parasitic capacitance and the transformer constitute a resonant circuit that is configured to control that the drive voltage signal of the power switch tube has a slow edge rate.

It should be noted that because a parasitic capacitance and a parasitic resistance exist between the gate and the source of the power switch tube, for a power switch tube that is connected to the two ends of the output winding, the output winding, the parasitic capacitance and the parasitic resistance of the power switch tube constitute a resonant circuit, and the current of a field winding does not change suddenly, so the voltage of the two ends of the output winding does not suddenly change, and the drive voltage signal that is provided for the power switch tube that is connected to the two ends of the output winding has a relatively slow edge rate. Because the two ends of a field winding are respectively connected to a power switch tube, the field winding, parasitic capacitances and parasitic resistances of the power switch tubes that are connected to the power switch tubes constitute a resonant circuit, besides, the resonant circuit constituted by the output winding may also be reflected on the field winding, thereby drive voltage signals of the power switch tubes that are connected to the two ends of the field winding respectively also have relatively slow edge rates, significantly reducing power consumption.

Certainly, a capacitance may be added to the two sides of the field winding in the transformer, which is connected to the resonant circuit to adjust a resonant frequency of the resonant circuit.

Figure 7:
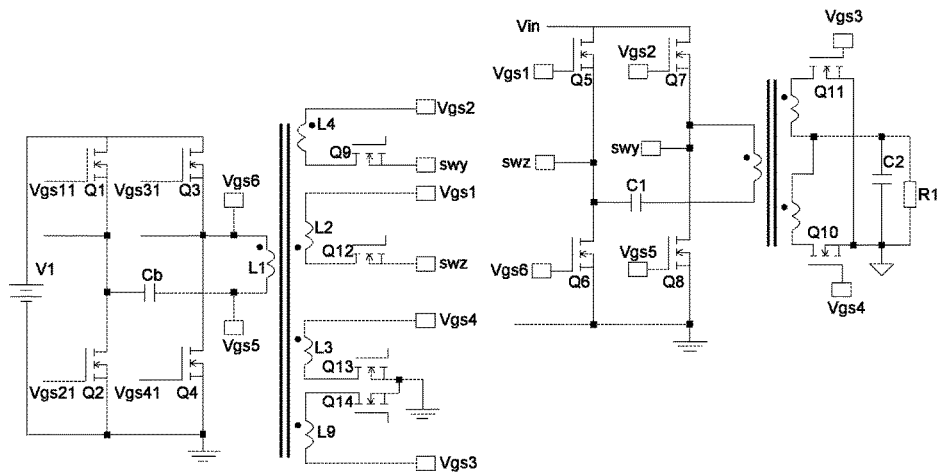
FIG. 7 is a schematic diagram of a typical application of another apparatus for driving a power switch tube according to an embodiment of the present disclosure.

FIG. 7 is a schematic diagram of a typical application of another apparatus for driving a power switch tube according to an embodiment of the present disclosure. As shown in FIG. 7, except for an input unit, a drive unit that is configured to drive a power switch transistor, a drive transformer, a group of power switch transistors and load which are shown in FIG. 3, the typical application of the driving apparatus further includes a rectifier unit that includes a group of rectifiers, and the rectifier unit includes a group of rectifier switches Q9, Q12, Q13 and Q14, configured to rectify a voltage signal that is output by an output winding of the drive transformer, and take the rectified voltage signal as a drive voltage signal of the power switch tube that is connected to the output winding.

The main difference between the typical application of the apparatus for driving the power switch tube according to the embodiment and the typical application according to the foregoing embodiment is that an output of each output winding of the drive transformer is connected to a rectifier to rectify an output signal, so the embodiment only describes the functions of the rectifier, and for the working processes and accomplished functions of other units of the typical application of the driving apparatus, reference may made to the foregoing embodiment, which are not described here again.

The voltage signals of the two ends of an output winding L2 of the drive transformer are Vgs1 and swz, and an output of the output winding L2 is connected to the switch Q12 to rectify the output of the output winding L2, and a drive voltage signal that is obtained after rectification is connected to the gate and the source of a power switch tube Q5 to provide a drive voltage signal for the power switch tube Q5, where when the voltage of an upper end of the L2 is positive, a body diode of the Q12 is conductive, the voltage of the two ends of the L2 is added to the gate of the power switch tube Q5, and a Q11 may be conductive by controlling the voltage that is input into the gate of the Q12; when the positive voltage of the L2 decreases, a drive voltage signal of the power switch tube Q5 degrades because the Q12 is conductive; and when the voltage of the L1 decreases to about zero, the Q12 is cutoff by controlling to implement that no drive voltage signal is provided for the power switch tube Q5 when the voltage of the L1 is negative. In this case, providing unipolar drive voltage for the power switch tube may be implemented, which has lower loss compared with using bipolar drive voltage.

Similarly, the switch Q13 may be connected to an output of an output winding L3 to rectify the output of the output winding L3, and a rectified drive voltage signal is connected to the gate and the source of a power switch tube Q10 to provide a unipolar drive voltage signal for the power switch tube 10, reducing loss. The switch Q9 may be connected to an output of an output winding L4 to rectify the output of the output winding L4, and the switch Q14 may be connected to an output of an output winding L9, so as to implement that unipolar drive voltage signals are provided for the power switch tube Q7 and the power switch tube Q11.

Figure 8:
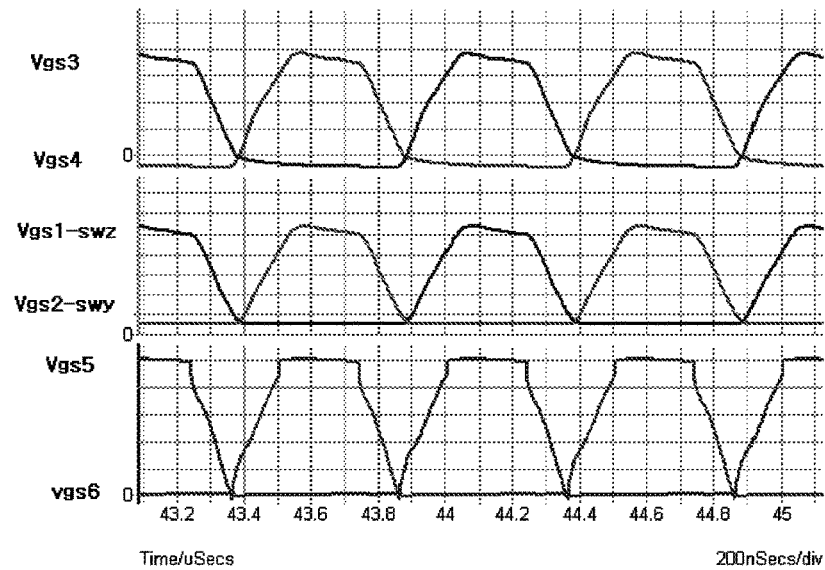
FIG. 8 is a sequence diagram of providing a drive voltage signal for each power switch tube based on a drive signal showed in FIG. 3 in an apparatus for driving a power switch tube according to an embodiment of the present disclosure.

FIG. 8 is a sequence diagram of providing a drive voltage signal for each power switch tube based on a drive signal showed in FIG. 4 in an apparatus for driving a power switch tube according to an embodiment of the present disclosure. As shown in FIG. 8, it may be seen that a drive voltage signal of each power switch tube has a relatively low edge rate, and the drive voltage signal of each power switch tube is a unipolar drive voltage signal by rectifying an output of an output winding, significantly reducing power consumption.

In the embodiment, in the typical application of the apparatus for driving the power switch tube according to the embodiment of the present disclosure, the field winding of the transformer is powered on according to the input group of drive signals, the drive voltage signal is input into the control end of the power switch tube through the field winding of the transformer, or the drive voltage signal is input into the control end of the power switch tube through the induced voltage of the output winding of the transformer induced from the field winding. By applying the apparatuses according to the embodiment of the present disclosure, low-loss driving of the power switch tube may be implemented, and reliability is improved.

Figure 9:
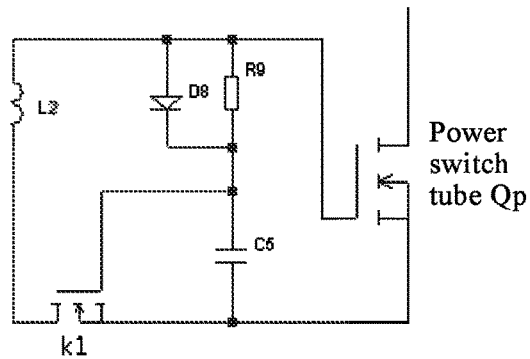
FIG. 9 is a schematic diagram of a self-driven rectifier apparatus that rectifies an output of an output winding in an apparatus for driving a power switch tube according to an embodiment of the present disclosure.

The foregoing embodiment introduces a method to provide a unipolar drive voltage signal for a power switch tube by rectifying an output of an output winding of the drive transformer, and a rectification manner for rectifying the output of the output winding may be a self-driven manner or non self-driven manner, which is respectively described through a specific embodiment as follows:

FIG. 9 is a schematic structural diagram of a self-driven rectifier apparatus that rectifies an output of an output winding in an apparatus for driving a power switch tube according to an embodiment of the present disclosure. As shown in FIG. 9, a self-driven rectifier apparatus includes a rectifier switch and a control circuit of the rectifier switch, where the rectifier switch is a switch K1, and the control circuit of the rectifier switch includes a diode D8, a resistance R9, and a capacitance C5.

As shown in FIG. 9, in the self-driven rectifier apparatus, the positive terminal of the diode D8 is connected to the upper end of an output winding L2, an end of the resistance R9, and the gate of a power switch tube Qp, and the negative terminal of the diode is connected to the other end of the R9, an end of the capacitance C5, and the gate of the switch K1; the other end of the capacitance C5 is connected to the source of the switch K1 and the source of the power switch tube Qp; and the drain of the switch K1 is connected to the lower end of the output winding L2.

When the voltage of the upper end of the output winding L2 is positive, a body diode of the switch K1 is conductive, the voltage of the two ends of the output winding L2 is added to the gate of the power switch tube Qp as a drive voltage, and the diode D8 and the resistance R9 are added to the gate of the switch K1 to conduct the K1. When the positive voltage of the output winding decreases, the drive voltage of the power switch tube Qp decreases because the switch K1 is conductive. Because the diode D8 is reversely cutoff, the electric charge of the capacitance C5 is released through the resistance R9. When the positive voltage of the output winding decreases to about 0, the switch K1 may be cutoff by adjusting the resistance R9 and the capacitance C5, so as to implement that drive voltage is provided for the power switch tube Qp when the voltage for interrupting the output winding L2 is a negative value. That is, by using the foregoing self-driven rectifier apparatus, implementation of the output winding L2 provides only unipolar drive voltage for the power switch tube Qp, significantly reducing power consumption.

Therefore, according to the self-driven rectifier apparatus provided in the embodiment and the apparatus for driving the power switch tube provided in the present disclosure, implementation of a unipolar voltage signal which has a relatively slow edge rate may be provided for the power switch tube, significantly reducing power loss, and improving reliability.

Figure 10:
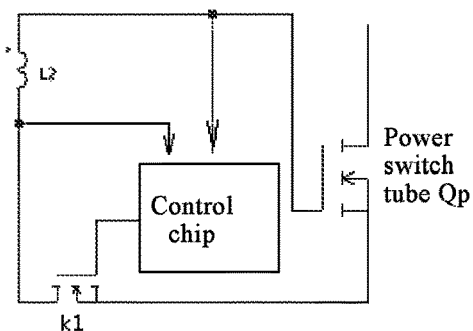
FIG. 10 is a schematic diagram of a non-self-driven rectifier apparatus that rectifies an output of an output winding in an apparatus for driving a power switch tube according to an embodiment of the present disclosure.

FIG. 10 is a schematic diagram of a non-self-driven rectifier apparatus that rectifies an output of an output winding in an apparatus for driving a power switch tube according to an embodiment of the present disclosure. As shown in FIG. 10, a non-self-driven apparatus includes a rectifier switch and a control circuit of the rectifier switch, where the rectifier switch is a switch K1, and the control circuit of the rectifier switch is a control chip.

As shown in FIG. 10, in the non-self-driven apparatus, the control chip is connected to the two ends of an output winding L2, the gate of the switch K1; the upper end of the output winding L2 is connected to the gate of a power switch tube Qp; and the drain of the switch K1 is connected to the lower end of the output winding L2, and the source of the switch K1 is connected to the source of the power switch Qp.

The control chip detects the voltage of the two ends of the output winding L2: controls the K1 to conduct when the voltage of the upper end is positive and the voltage of the lower end is negative; and controls K1 to make it cutoff when the control chip detects that the voltage of the upper end is negative and the voltage of the lower end is positive, so as to implement that the output winding L2 provides only a unipolar drive voltage for the power switch tube Qp, significantly reducing power loss.

Therefore, according to the non-self-driven rectifier apparatus provided in the embodiment and the apparatus for driving the power switch tube provided in the present disclosure, implementation of a unipolar voltage signal which has a relatively slow edge rate may be provided for the power switch tube, significantly reducing power loss, and improving reliability.

Figure 11:
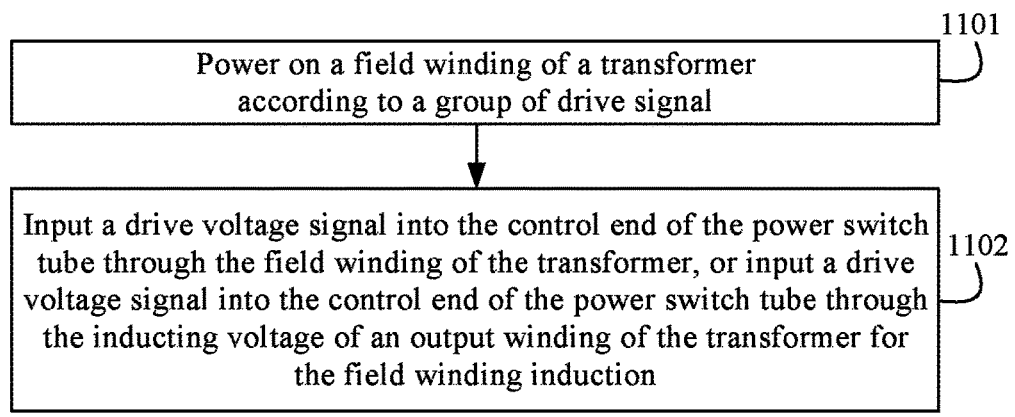
FIG. 11 is a flowchart of a method for driving a power switch tube according to an embodiment of the present disclosure.

It should be noted that the foregoing describes only several specific embodiments of the apparatus for driving the power switch tube according to the embodiments of the present disclosure, which are not intended to limit the protection scope of the driving apparatus according to the embodiments of the present disclosure. An embodiment of the present disclosure further provides a method for driving a power switch tube, and FIG. 11 is a flowchart of a method for driving a power switch tube according to an embodiment of the present disclosure. As shown in FIG. 11, the embodiment includes the following steps:

Step 1101: Power on a field winding of a transformer according to a group of drive signals, and the group of drive signals includes a first drive signal, a second drive signal, a third drive signal, and a fourth drive signal, where the first drive signal and the second drive signal are complementary signals, and a dead time is between the first drive signal and the second drive signal for a first field-effect transistor of the first drive signal and a second field-effect transistor of the second drive signal to implement zero-voltage switching; the third drive signal and the fourth drive signal are complementary signals, and a dead time is between the third drive signal and the fourth drive signal for a third field-effect transistor of the third drive signal and a fourth field-effect transistor of the fourth drive signal to implement zero-voltage switching; the phase difference between the first drive signal and the third drive signal is 180 degrees for alternately conducting the first field-effect transistor and the third field-effect transistor, and the phase difference between the second drive signal and the fourth drive signal is 180 degrees for alternately conducting the second field-effect transistor and the fourth field-effect transistor; and the first field-effect transistor, the second field-effect transistor, the third field-effect transistor, and the fourth field-effect transistor constitute a full-bridge structure, and the full-bridge structure is connected to the transformer.

The group of drive signals may include the first drive signal, the second drive signal, the third drive signal and the fourth drive signal. The first drive signal and the second drive signal are complementary signals, and the dead time is between the first drive signal and the second drive signal, that is, there exists a period when the first drive signal and the second drive signal are simultaneously in low level, so it may be ensured that the first field-effect transistor controlled by the first drive signal or the second field-effect transistor controlled by the second drive signal implements zero-voltage switching when the first drive signal or the second drive signal changes from low level to high level, significantly reducing drive loss; the third drive signal and the fourth drive signal are complementary signals, and the dead time is between the third drive signal and the fourth drive signal, that is, there exists a period when the third drive signal and the fourth drive signal are simultaneously in low level, so it may be ensured that the third field-effect transistor controlled by the third drive signal or a fourth field-effect transistor controlled by the fourth drive signal implements zero-voltage switching when the third drive signal or the fourth drive signal changes from low level to high level, significantly reducing drive loss; where the phase difference between the first drive signal and the third drive signal is 180 degrees, that is, the difference of timing is half of a period, for alternately conducting the first field-effect transistor and the third field-effect transistor, and the phase difference between the second drive signal and the fourth drive signal is 180 degrees, that is, the difference of timing is half of a period, for alternately conducting the second field-effect transistor and the fourth field-effect transistor.

The first drive signal is input into the gate of the first field-effect transistor, the second drive signal is input into the gate of the second field-effect transistor, the third drive signal is input into the gate of the third field-effect transistor, and the fourth drive signal is input into the gate of the fourth field-effect transistor, that is, the first drive signal, the second drive signal, the third drive signal, and the fourth drive signal are configured to control the conduction or cutoff statuses of first field-effect transistor, the second field-effect transistor, the third field-effect transistor, and the fourth field-effect transistor, respectively. The first field-effect transistor, the second field-effect transistor, the third field-effect transistor and the fourth field-effect transistor constitute a full-bridge structure, where an end of the field winding of the transformer is connected to the middle point of a bridge arm of the full-bridge structure, and the other end of the field winding of the transformer is directly connected to the middle point of another bridge arm of the full-bridge structure or is connected to the middle point of another bridge arm of the full-bridge structure through a capacitance. The conduction or cutoff statuses of the first field-effect transistor, the second field-effect transistor, the third field-effect transistor and the fourth field-effect transistor change with the variation of the group of signals, so the current that passes through the field winding of the transformer changes, so as to implement that the field winding of the transformer is powered on.

Step 1102: Input a drive voltage signal into the control end of the power switch tube through the field winding of the transformer, or input a drive voltage signal into the control end of the power switch tube through the induced voltage of an output winding of the transformer induced from the field winding.

The transformer has a plurality of field windings, where there are at least one field winding L1 and one output winding, and each end of a field winding may be connected to the control end, that is, the gate, of the power switch tube, and the two ends of each output winding may be directly connected to the gate and the source of the power switch tube respectively, so the conduction or cutoff statuses of the first field-effect transistor, the second field-effect transistor, the third field-effect transistor and the fourth field-effect transistor change with the variation of the group of drive signals, and the voltage of the two ends of the field winding of the transformer changes, the current that passes through the field winding of the transformer changes, and the induced current and induced voltage generated by the output winding changes. Therefore, a drive voltage signal of the power switch tube is connected to the field winding and/or the output winding changes.

It should be noted that because a parasitic capacitance and a parasitic resistance exist between the gate and the source of the power switch tube, for a power switch tube connected to the two ends of an output winding, the output winding, the parasitic capacitance and the parasitic resistance of the power switch tube constitute a resonant circuit, and the current of a field winding does not change suddenly, so the current of the two ends of the output winding does not change suddenly, and the drive voltage signal that is provided for the power switch tube that is connected to the two ends of the output winding has a relatively slow edge rate. Because the two ends of a field winding are respectively connected to a power switch tube, the field winding, parasitic capacitances and parasitic resistances of the power switch tubes connected to the power switch tubes constitute a resonant circuit, and the resonant circuit constituted by the output winding may also have an equivalent effect on the field winding, thereby drive voltage signals of the power switch tubes that are connected to the two ends of the field winding respectively also have relatively slow edge rates, significantly reducing power consumption.

Before an output winding provides a drive voltage signal for the power switch tube, an output voltage signal may be rectified firstly to obtain a unipolar drive voltage signal. Using a unipolar drive voltage signal to drive the power switch tube has a lower loss than using a bipolar drive voltage signal to drive the power switch tube.

The method for driving the power switch tube according to the embodiment of the present disclosure is to power on the field winding of the transformer according to the input group of drive signals, input the drive voltage signal into the control end of the power switch tube through the field winding of the transformer, or input the drive voltage signal into the control end of the power switch tube through the induced voltage of the output winding of the transformer induced from the field winding. By applying the method and apparatuses according to the embodiments of the present disclosure, low-loss driving of the power switch tube may be implemented, and reliability is improved.

The first field-effect transistor Q1, the second field-effect transistor Q2, the third field-effect transistor Q3, and the fourth field-effect transistor Q4 in the foregoing embodiments are N-type field-effect transistors, and when a drive signal is low, the first field-effect transistor Q1, the second field-effect transistor Q2, the third field-effect transistor Q3, and the fourth field-effect transistor Q4 are cutoff, when a drive signal is high, first field-effect transistor Q1, the second field-effect transistor Q2, the third field-effect transistor Q3, and the fourth field-effect transistor Q4 are conductive. It should be noted that the foregoing field-effect transistors may not necessarily be N-type transistors, and they may be P-type transistors. It should be noted that all other schematic diagrams of the driving apparatuses obtained by persons skilled in the art based on the schematic diagrams of the driving apparatuses of the present disclosure without creative efforts shall fall within the protection scope of the present disclosure.

Persons skilled in the art may be further aware that, in combination with the examples described in the embodiments here, units and algorithm steps can be implemented by electronic hardware, computer software, or a combination thereof. In order to clearly describe the interchangeability between the hardware and the software, the foregoing has generally described compositions and steps of every embodiment according to functions. Whether the functions are performed by hardware or software depends on particular applications and design constraint conditions of the technical solutions. Persons skilled in the art may use different methods to implement the described functions for each particular application, but it should not be considered that the implementation goes beyond the scope of the present disclosure.

The steps of a method or algorithm described in connection with the embodiments disclosed herein may be embodied directly in hardware, in a software module executed by a processor, or in a combination of the two. The software module may be located in a Random Access Memory (RAM), a computer memory, a Read Only Memory (ROM), an Electrically Programmable ROM, an Electrically Erasable Programmable ROM, a register, a hard disk, a removable disk, a compact disc read-only memory (CD-ROM), or any other storage media well-known in the art.

The objectives, technical solutions, and benefits of the present disclosure are further described in detail in the foregoing specific embodiments. It should be understood that the foregoing descriptions are merely specific embodiments of the present disclosure, but are not intended to limit the protection scope of the present disclosure. Any modification, equivalent replacement, or improvement made within the spirit and principle of the present disclosure shall fall within the protection scope of the present disclosure.

What is claimed is:

1. An apparatus for driving a power switch tube, comprising:
   a driver;
   a transformer coupled to the driver;
   a power switch tube coupled to the transformer; and
   an input circuit coupled to the driver and configured to input a group of drive signals into the driver,
   wherein the group of drive signals comprises a first drive signal, a second drive signal, a third drive signal, and a fourth drive signal,
   wherein the first drive signal and the second drive signal are complementary signals,
   wherein a first dead time is between the first drive signal and the second drive signal for a first field-effect transistor of the first drive signal and a second field-effect transistor of the second drive signal to implement zero-voltage switching,
   wherein the third drive signal and the fourth drive signal are complementary signals,
   wherein a second dead time is between the third drive signal and the fourth drive signal for a third field-effect transistor of the third drive signal and a fourth field-effect transistor of the fourth drive signal to implement zero-voltage switching, wherein a first phase difference between the first drive signal and the third drive signal is 180 degree for alternately conducting the first field-effect transistor and the third field-effect transistor, wherein a second phase difference between the second drive signal and the fourth drive signal is 180 degree for alternately conducting the second field-effect transistor and the fourth field-effect transistor, wherein the driver comprises the first field-effect transistor, the second field-effect transistor, the third field-effect transistor, and the fourth field-effect transistor, wherein the driver is configured to power on a field winding of the transformer according to the group of drive signals input by the input circuit, wherein the transformer has specified magnetizing inductance and is configured to:
store energy; and
either input a drive voltage signal into a control end of the power switch tube through the field winding of the transformer according to a stored energy or input a drive voltage signal into the control end of the power switch tube through an induced voltage of an output winding of the transformer induced from the field winding according to the stored energy, wherein the power switch tube is coupled to the transformer through the control end and comprises a parasitic capacitor, wherein the parasitic capacitor and the transformer constitute a resonant circuit configured to control that the drive voltage signal of the power switch tube has a slow edge rat;

wherein the transformer is configured such that:
when the control end of the power switch tube is coupled to an end of the field winding of the transformer, a terminal voltage of the end of the field winding of the power switch tube provides a drive voltage signal for the control end of the power switch tube; and
when the control end of the power switch tube is coupled to the output winding of the transformer, the induced voltage of the output winding of the transformer induced from the field winding provides a drive voltage signal for the control end of the power switch tube.

2. The apparatus for driving the power switch tube according to claim 1, wherein a drain of the first field-effect transistor is coupled to a positive terminal of a direct current power supply, wherein a source of the first field-effect transistor is coupled to a drain of the second field-effect transistor, wherein a gate of the first field-effect transistor is coupled to the input circuit and is configured to receive the first drive signal, wherein a source of the second field-effect transistor is grounded, wherein a gate of the second field-effect transistor is coupled to the input circuit and is configured to receive the second drive signal, wherein a drain of the third field-effect transistor is coupled to the positive terminal, wherein a source of the third field-effect transistor is coupled to a drain of the fourth field-effect transistor and an end of a field winding of the transformer, wherein a gate of the third field-effect transistor is coupled to the input circuit and is configured to receive the third drive signal, wherein a source of the fourth field-effect transistor is grounded, and wherein a gate of the fourth field-effect transistor is coupled to the input circuit and is configured to receive the fourth drive signal.

3. The apparatus for driving the power switch tube according to claim 2, wherein the driver further comprises a first capacitor, wherein an end of the first capacitor is coupled to the source of the first field-effect transistor and the drain of the second field-effect transistor, and wherein another end of the first capacitor is coupled to another end of the field winding of the transformer.

4. The apparatus for driving the power switch tube according to claim 2, wherein the driver is configured to power on the field winding of the transformer according to a connection relationship between the field winding of the transformer and the driver when the first drive signal, the second drive signal, the third drive signal, and the fourth drive signal change according to a preset frequency.

5. The apparatus for driving the power switch tube according to claim 1, wherein the apparatus further comprises a second capacitor, and wherein the second capacitor is coupled to the resonant circuit and is configured to adjust a resonant frequency of the resonant circuit.

6. The apparatus for driving the power switch tube according to claim 1, wherein a duty cycle of first drive signal and a duty cycle of the second drive signal are different, and wherein a duty cycle of third drive signal and a duty, cycle of the fourth drive signal are different.

7. A method for driving a power switch tube, comprising:
powering on a field winding of a transformer according to a group of drive signals so the transformer stores energy; and
either inputting a drive voltage signal into a control end of the power switch tube through the field winding of the transformer or inputting a drive voltage signal into the control end of the power switch tube through an induced voltage of an output winding of the transformer induced from the field winding, so the transformer periodically stores and releases energy and makes a field-effect transistor, driven by the group of drive signals, implement zero-voltage switching according to a change of a transformer energy and a change of the group of drive signals,
wherein either inputting the drive voltage signal into the control end of the power switch tube through the field winding of the transformer, or inputting the drive voltage signal into the control end of the power switch tube through the induced voltage of the output winding of the transformer induced from the field winding comprises:
providing a drive voltage signal for the control end of the power switch tube by a terminal voltage of an end of the field winding of the power switch tube when the control end of the power switch tube is coupled to an end of the field winding of the transformer; and
providing a drive voltage signal for the control end of the power switch tube by the induced voltage of the output winding of the transformer induced from the field winding when the control end of the power switch tube is coupled to the output winding of the transformer.

8. The method for driving the power switch tube according to claim 7, wherein the group of drive signals comprises a first drive signal, a second drive signal, a third drive signal, and a fourth drive signal, wherein the first drive signal is input into a gate of a first field-effect transistor so as to control a status of the first field-effect transistor, wherein the second drive signal is input into a gate of a second field-effect transistor so as to control a status of the second field-effect transistor, wherein the third drive signal is input into a gate of a third field-effect transistor so as to control a status of the third field-effect transistor, wherein the fourth drive signal is input into a gate of a fourth field-effect transistor so as to control a status of the fourth field-effect transistor, and wherein the first field-effect transistor, the second field-effect transistor, the third field-effect transistor, and the fourth field-effect transistor constitute a full-bridge structure.

9. The method for driving the power switch tube according to claim 8, wherein the first drive signal and the second drive signal are complementary signals, wherein a first dead time, which is between the first drive signal and the second drive signal, is used for the first field-effect transistor and the second field-effect transistor to implement zero-voltage switching, wherein the third drive signal and the fourth drive signal are complementary signals, wherein a second dead time, which is between the third drive signal and the fourth drive signal, is used for the third field-effect transistor and the fourth field-effect transistor to implement zero-voltage switching, wherein a first phase difference between the first drive signal and the third drive signal is 180 degrees, and wherein a second phase difference between the second drive signal and the fourth drive signal is 180 degrees.

10. The method for driving the power switch tube according to claim 9, wherein powering on the field winding of the transformer according to the group of drive signals comprises powering on the field winding of the transformer according to a connection relationship between the field winding of the transformer and the full-bridge structure when the group of signals changes according to a preset frequency wherein the connection relationship between the field winding of the transformer and the full-bridge structure is that an end of the field winding of the transformer is coupled to a middle point of a bridge arm of the full bridge structure, and wherein another end of the field winding of the transformer is coupled to a middle point of another bridge arm of the full-bridge structure.

11. The method for driving the power switch tube according to claim 10, further comprising performing rectifier processing on the induced voltage of the output winding of the transformer induced from the field winding so as to obtain the drive voltage signal before inputting the drive voltage signal into the control end of the power switch tube through the induced voltage of the output winding of the transformer induced from the field winding.

* * * * *